(12) United States Patent
Jacquot et al.

(10) Patent No.: US 10,658,561 B2
(45) Date of Patent: May 19, 2020

(54) THERMOELECTRIC ELEMENT AND THERMOELECTRIC CONVERTER INCLUDING AT LEAST ONE SUCH ELEMENT

(71) Applicants: UNIVERSITE DE LORRAINE, Nancy (FR); CENTRE NATIONAL DE LA RECHERCHE SCIENTIFIQUE (CNRS), Paris (FR)

(72) Inventors: Alexandre Jacquot, Lörrach (DE); Bertrand Lenoir, Jeanmenil (FR); Eugen Geczi, Freiburg (DE); Iurii Kogut, Lviv (UA); Driss Kenfaui, Vandoeuvre les Nancy (FR); Philippe Masschelein, Vaudigny (FR)

(73) Assignees: UNIVERSITE DE LORRAINE, Nancy (FR); CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 110 days.

(21) Appl. No.: 15/746,714

(22) PCT Filed: Aug. 18, 2016

(86) PCT No.: PCT/FR2016/052091
§ 371 (c)(1),
(2) Date: Jan. 22, 2018

(87) PCT Pub. No.: WO2017/032943
PCT Pub. Date: Mar. 2, 2017

(65) Prior Publication Data
US 2018/0226556 A1    Aug. 9, 2018

(30) Foreign Application Priority Data

Aug. 21, 2015  (FR) ...................................... 15 57857

(51) Int. Cl.
*H01L 35/18* (2006.01)
*H01L 35/08* (2006.01)
(Continued)

(52) U.S. Cl.
CPC .............. *H01L 35/18* (2013.01); *H01L 35/08* (2013.01); *H01L 35/30* (2013.01); *H01L 35/325* (2013.01); *H01L 35/34* (2013.01)

(58) Field of Classification Search
CPC ......................... H01L 35/00–34; H01L 27/16
(Continued)

(56) References Cited

U.S. PATENT DOCUMENTS 5,841,064 A * 11/1998 Maekawa ............... H01L 35/32
136/203
7,402,910 B2   7/2008 Bottner et al.
(Continued)

FOREIGN PATENT DOCUMENTS

JP    H06310765 A    11/1994
JP    2009260173 A   11/2009

OTHER PUBLICATIONS

JP-A-H06-310765 English Translation (Year: 1994).*
International Search Report issued in PCT/FR2016/052091 dated Nov. 11, 2016.

*Primary Examiner* — Bach T Dinh
(74) *Attorney, Agent, or Firm* — Marshall, Gerstein & Borun LLP

(57) ABSTRACT

A thermoelectric element, particularly for a thermoelectric converter, includes an assembly of constituent layers comprising a central layer made of p- or n-type thermoelectric material, then, in an assembly direction, and on each side of said central layer, an intermediate layer forming a diffusion barrier followed by a buffer layer made of composite metal material. The buffer layers are intended to be secured to metal electrodes, characterized in that the cumulative thickness of the two buffer layers is greater than or equal to 50% of the thickness of the central layer, and preferably greater than or equal to 100% of the thickness of the central layer and very preferably greater than or equal to 200% of the (Continued)

thickness of the central layer, and in that the constituent material of the buffer layers is an alloy of two metals chosen from the family: $Ti_xAg_{1-x}$, $V_xFe_{1-x}$, $V_xAg_{1-x}$, $Ti_xFe_{1-x}$, where $0<x<1$.

20 Claims, 2 Drawing Sheets

(51) Int. Cl.
    *H01L 35/30*     (2006.01)
    *H01L 35/32*     (2006.01)
    *H01L 35/34*     (2006.01)

(58) Field of Classification Search
    USPC .................................................. 136/200–242
    See application file for complete search history.

(56) References Cited

U.S. PATENT DOCUMENTS

| | | |
|---|---|---|
| 2006/0017170 A1 | 1/2006 | Chen et al. |
| 2010/0252086 A1* | 10/2010 | Fujie ............... C30B 11/002 136/238 |
| 2012/0006376 A1 | 1/2012 | Fleurial et al. |
| 2014/0096809 A1* | 4/2014 | Kim ............... H01L 35/16 136/205 |
| 2014/0216515 A1 | 8/2014 | Ochi et al. |
| 2015/0318460 A1* | 11/2015 | Suzuki ............... C22C 5/08 136/205 |
| 2016/0218268 A1* | 7/2016 | Maruyama ............. H01L 35/32 |

\* cited by examiner

THERMOELECTRIC ELEMENT AND THERMOELECTRIC CONVERTER INCLUDING AT LEAST ONE SUCH ELEMENT

TECHNICAL FIELD

The present disclosure relates to the general technical field of thermoelectric converters and thermoelectric elements used to produce such converters. More particularly, the disclosure concerns the design and manufacture of thermoelectric elements, comprising a thermoelectric layer in bulk form and with very reduced thickness, which are used in the manufacture of thermoelectric converters. Thermoelectric layer in bulk form and with reduced thickness should be understood as meaning the layer is manufactured by methods borrowed from powder metallurgy, and not from vacuum deposition techniques (commonly called thin layers) by physical or chemical means.

BACKGROUND

Thermoelectric converters or devices enable "cold" (refrigeration/air conditioning applications) to be produced, but it is also an effective way to recover waste heat to produce electricity. In this latter field, they are considered for use in the automobile industry, for example, for conversion of the heat from the exhaust gases.

Examples of other fields of application of the thermoelectric elements and converters as presented hereinafter are fields of application such as micro-cogeneration particularly from biomass, supplying electricity to Internet connected objects, power supply for networks of sensors, power supply for systems in remote and hostile environments, as well as power supply for the space domain.

It is known that a reduction of the dimensions of thermoelectric elements, also called thermoelectric legs, makes it possible to obtain an increased electric power density. Reference can be made to the documents U.S. Pat. No. 6,388,185 B1 and U.S. Pat. No. 5,712,448 A1. Similarly, it is known that a temperature increase at the terminals of the thermoelectric legs makes it possible to increase the electric power density. However, because of the significant thermo-mechanical stresses related to differential thermal expansion coefficients between its various constituent elements; it is too often considered very difficult or even impossible to reduce the dimensions of such thermoelectric elements while still ensuring reliable operation with an appreciable temperature difference.

Indeed, thermoelectric materials in bulk form generally have a fragile mechanical behavior, and thermal mechanical stresses cause irreversible damage (cracks), particularly near the interface with the metal electrodes or at the center of the thermoelectric material when the material is of good quality. This results in significantly breaking-down the performance of the thermoelectric converter.

Added to this difficulty is that related to problems of chemical diffusion between the thermoelectric legs and the electrodes, problems that intensify with increases in temperature. The diffusion phenomenon leads to a progressive break-down of the thermoelectric and mechanical properties, which ultimately lead to a malfunction of the device.

The most successful thermoelectric generator incorporating thin legs was the one developed by the MICROPELT Company. Reference can be made, for example, to the document U.S. Pat. No. 7,402,910 B2. However, the used thermoelectric material, based on Bi2Te3, and the method of manufacturing thermoelectric elements by physical deposition (thin layers), establish severe practical limits on the useful temperature range (around the ambient temperature) and on the dimensions of the converters (several tens of microns thick). This thin layer-based technology therefore remains restricted to applications where the needs for electrical power do not exceed some 10 mW.

To overcome the technical problems set forth above, present day thermoelectric generators are composed of n- and p-type elements having a length on the order of one centimeter. These elements are brazed to metal electrodes with a thin layer of brazing material.

SUMMARY OF THE DISCLOSURE

Therefore, the objective of the presently disclosed embodiments is to overcome the disadvantages of the prior art by providing a new thermoelectric element or converter comprising a thermoelectric layer in bulk form and with very reduced thickness, which is used in the manufacture of thermoelectric converters having considerably improved performance.

Another objective is to propose a new thermoelectric element or converter obtained by using an efficient and economical manufacturing method.

Another objective is to propose a new thermoelectric element or converter of improved reliability over time and within a relatively high temperature range, for example between 300 K and 900 K.

The objectives are achieved by means of a thermoelectric element particularly for a thermoelectric converter including an assembly of constituent layers comprising a central layer of p- or n-type thermoelectric material, then, in an assembly direction, and on each side of said central layer, an intermediate layer forming a diffusion barrier followed by a buffer layer made of composite metal material, said buffer layers being intended to be secured to metal electrodes, characterized in that the cumulative thickness of the two buffer layers is greater than or equal to 50% of the thickness of the central layer, and preferably greater than or equal to 100% of the thickness of the central layer and very preferably greater than or equal to 200% of the thickness of the central layer, and in that the constituent material of the buffer layers is an alloy of two metals chosen from the family: TixAg1−x, VxFe1−x, VxAg1−x, TixFe1−x, where 0<x<1.

The central layer, also called active layer, is preferably produced in bulk form and has a reduced thickness.

According to one embodiment of the thermoelectric element, the central layer has a thickness between 200 µm and 2000 µm.

According to one embodiment of the thermoelectric element, the thickness of each buffer layer is between 500 µm and 5000 µm.

According to one embodiment of the thermoelectric element, each intermediate layer has a thickness between 10 µm and 200 µm.

According to one embodiment, the thermoelectric element has, along a section transverse to the assembly direction, a surface area between 4 mm2 and 100 mm2.

According to one embodiment of the thermoelectric element, the constituent material of the central layer is skutterudite, for example based on n- or p-type CoSb3.

According to one embodiment of the thermoelectric element, the constituent material of the buffer layers is an alloy of two metals chosen from the family: TixAg1−x, VxFe1−x, VxAg1−x, TixFe1−x, with x being an atomic fraction strictly between 0 and 1, i.e. with 0<x<1 (x strictly greater than 0 and x strictly less than 1).

For example, a thermoelectric material having a thermal expansion coefficient of 10–5 K−1 will combine well for example with a composite $Ti_xAg_{1-x}$ where x=0.86, while a thermoelectric material having a thermal expansion coefficient of 13×10−6 K−1 will combine better with a material having a composition where x=0.57. These figures remain valid at ±30% for $V_xFe_{1-x}$, $V_xAg_{1-x}$ and $Ti_xFe_{1-x}$ type composites.

According to one embodiment of the thermoelectric element, the constituent material of the intermediate layers is chosen from the family of materials comprising nickel, titanium, chromium, tantalum, hafnium, niobium, zirconium, vanadium, tungsten, yttrium, tantalum nitride, indium oxide, copper silicide, tungsten nitride, titanium nitride.

The objectives are also achieved by a thermoelectric converter comprising two plates of ceramic material that are parallel to each other and spaced apart from each other by an assembly of thermoelectric elements such as the aforementioned one, metal electrodes being secured on the one hand to the facing surfaces of said plates according to a specific distribution, and on the other hand to the buffer layers via a layer of brazing material.

According to one embodiment, the layer of brazing material extending between the buffer layers and the electrodes contains aluminum in particular.

According to another embodiment, the thickness of the layer of brazing material is equal to or less than the thickness of the buffer layers of composite metal material. The thickness of the layer of brazing material is for example between 50% and 200% of the thickness of the electrodes printed on the plates of ceramic material.

Advantageously, said brazing material or layer of brazing material is distributed equally over all free surfaces and over the full length of the electrodes printed on the plates of ceramic material in order to reduce the electrical resistance thereof. The brazing material also at least partially covers the buffer layers. The buffer layers are used to increase, for example by 50% to 200%, the thickness of the metal electrodes connecting the central thermoelectric layers by adding brazing material onto the free surfaces thereof.

According to one embodiment of the thermoelectric converter, the layer of brazing material covers the entire free surface of the metal electrode, said free surface being the surface opposite to the surface of the electrode connected to the plate of ceramic material.

According to one embodiment of the thermoelectric converter, the layer of brazing material also extends around the buffer layer, forming a peripheral collar surrounding said buffer layer over a portion of the height thereof.

The thermoelectric element has the great advantage of enabling easy assembly between the buffer layers and the copper electrodes, possibly nickeled, by using a brazing material containing aluminum.

Said brazing material can be used in a thick layer and advantageously wets the buffer layer. Surface tension makes it possible to produce a strong assembly of the two materials. Thus, an excellent mechanical cohesion is obtained as well as optimal electrical conduction allowing stronger currents to be used. The contact resistance between the electrode and the buffer layer are negligible compared to the intrinsic resistance of the thermoelectric elements. Indeed, they are too weak to be measurable.

Another advantage of the thermoelectric element is more particularly related to the manufacturing method thereof, which is especially easy to implement. In fact, only two steps are needed. The first step consists of producing the buffer layers and the second step consists of assembling all of the constituent layers. Said second step is achieved in an SPS (Spark Plasma Sintering) frame.

Another advantage of the thermoelectric element is the achievement of at least triple the power density, even though using between 4 and 5 times less thermoelectric material in the central layer. Thus, a substantial savings is obtained.

Moreover, the thermoelectric materials used, in this instance skutterudite in bulk state, have very good thermoelectric performance but are known to be relatively fragile.

The thermoelectric element makes it possible not only to reduce dimensions (thickness of the central layer of the thermoelectric material) but also to increase the electrical performance thereof. In addition, it makes it possible to better withstand the thermomechanical stresses due to the differences between thermal expansion coefficients of the different materials.

Manufacturing in a single step by hot pressing (based on the SPS technique) of the thermoelectric element (thermoelectric leg), consisting in particular of connecting the upper and lower buffer layers and of insulating it by an intermediate layer constituting a diffusion barrier, is substantially simplified compared to the solution which would consist of depositing the diffusion barrier by physical deposition (thin layer). That solution (thin layer) is particularly unsuitable for the thicknesses of the diffusion barriers concerned, namely several microns to several tens of microns.

The simplification of this method is based on the establishment of connections on both sides of the thermoelectric material, under optimized conditions of hot-pressing, with the diffusion barrier and the buffer layer, together with the sintering of the thermoelectric material previously added in powder form.

The thickness of the buffer layer is used to advantage during brazing with the metal electrodes, for example of copper, since it prevents the brazing material from overflowing onto the thermoelectric element. However, the brazing material overflows onto the metal electrodes and onto the buffer layers, which enables the electrical resistances to be reduced, and ultimately promotes the passage of higher current.

The reduction of stresses, below the breaking stress of the skutterudite, is essentially related to the composite materials of the buffer layers that give them a thermal expansion coefficient similar to that of the thermoelectric material, but also to the relatively significant thickness of said buffer layers, thus enabling mechanical stresses to be absorbed and not concentrated in the thermoelectric material.

Moreover, said method makes it possible to obtain very low contact resistances. For example, the contact resistances measured at the interfaces of skutterudite/diffusion barrier and $TixAg(1-x)$ layers have shown values as low as 2 μΩ cm2 (p-type element) and 7 μΩ cm2 (n-type element). They are 3 to 10 times lower than the best values reported to date. Reference can be made to the Fleurial et al. document (US 2012/0006376 A1).

Another advantage is the possibility of using laser brazing technology for securing the buffer layers to the metal electrodes, or any additive-type methods to construct the thermoelectric converter, including heat exchangers. The materials are therefore less subjected to thermal shocks.

Another advantage of the thermoelectric element is in the reduction of the size thereof. Moreover, the surface of the thermoelectric material exposed to the atmosphere is also reduced, which increases the thermal stability thereof. The buffer layers also constitute a good anchoring point for a physical barrier, for example encapsulation, avoiding the decomposition (sublimation) of the thermoelectric material operated at high temperature. Reference can be made, for example, to the document U.S. Pat. No. 7,480,984 B1.

BRIEF DESCRIPTION OF THE DRAWINGS

Other characteristics and advantages will be seen more clearly from the following description, provided with reference to the appended drawings, provided by way of non-limiting examples, in which.

DETAILED DESCRIPTION

The structurally and functionally identical elements shown in several different figures are assigned the same numerical or alphanumerical reference.

Figure 1:
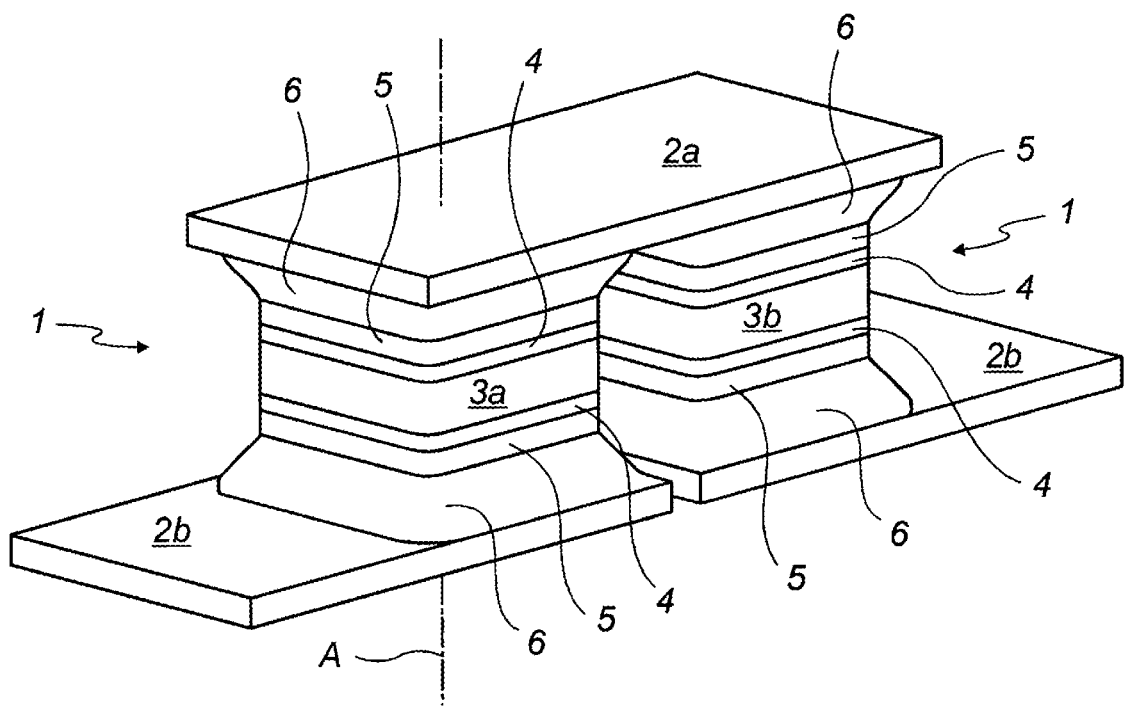
FIG. 1 is a perspective view of an embodiment of a thermoelectric element, connected to electrodes.

FIG. 1 is a perspective view of an embodiment of a thermoelectric element (1). More precisely, FIG. 1 shows an assembly of two thermoelectric elements (1), assembled by means of an upper electrode (2a). Each of the thermoelectric elements (1) is also connected to a respective lower electrode (2b). The electrodes (2a) and (2b) are of metal type.

The thermoelectric element (1) includes an assembly of constituent layers comprising in particular a central layer (3a) or (3b). The central layer (3a) is for example made of an n-type thermoelectric material and the central layer (3b) is for example made of a p-type thermoelectric material. The central layers (3a) and (3b) are therefore preferably made respectively of n- and p-type skutterudite.

The thermoelectric element (1) also comprises in a longitudinal assembly direction A and on each side of the central layer (3a) and (3b) an intermediate layer (4) forming a diffusion barrier.

The purpose of the diffusion barrier is to prevent the diffusion of chemical elements from the thermoelectric material towards buffer layers (5) and vice versa, in this way the electrical, thermal and mechanical properties thereof can be preserved during operation of the thermoelectric converter.

The constituent material of the intermediate layers (4) is chosen from the family of materials comprising nickel, titanium, chromium, tantalum, hafnium, niobium, zirconium, vanadium, yttrium, tungsten, tantalum nitride, indium oxide, copper silicide, tungsten nitride and titanium nitride.

The constituent materials of the intermediate layers (4) are advantageously chosen to adapt to the nature of the central layer (3a) or (3b), namely the n- or p-type thermoelectric material. With skutterudites, several of the metals previously cited have led to very positive results.

Each intermediate layer (4) is followed by a buffer layer (5) of composite metal material. The buffer layers (5) are intended to be secured to the metal electrodes (2a) or (2b). Said secure fastening is preferably achieved by means of a layer of brazing material (6) containing in particular aluminum. The significant thickness of the buffer layers (5) makes it possible to use a larger quantity of brazing material compared to that of the known state of the art, without risking a short-circuit.

Moreover, it is advantageous that the brazing material (6) overflows onto the buffer layer (5) in order to improve its electrical performance.

The constituent material of the buffer layers (5) is preferably a composite of two metals chosen from the family of pairs of metals comprising silver and titanium, iron and vanadium, silver and vanadium and iron and titanium. The proportions of the two constituent materials of the buffer layer (5) are specified as follows, with x being an atomic fraction falling strictly between 0 and 1, i.e. with 0<x<1. The constituent composite material of the buffer layers (5) is thus a composite of two metals chosen from the family: $Ti_xAg_{1-x}$, $V_xFe_{1-x}$, $V_xAg_{1-x}$, $Ti_xFe_{1-x}$.

Each buffer layer (5) is connected to the metal electrodes by the layer of brazing material (6).

Figure 2:
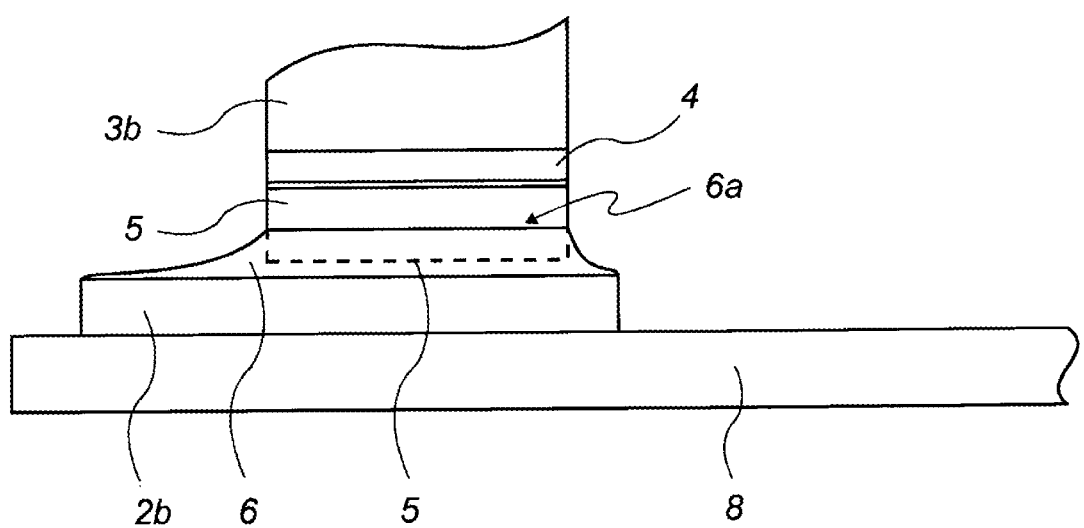
FIG. 2 is a partial representation of another embodiment of a thermoelectric element.

The layer of brazing material (6), as illustrated in FIG. 2, connecting each buffer layer (5) to the electrodes (2a, 2b), is also spread over all of the free surfaces and over the full length of the electrodes (2a, 2b) printed on the plates (8, 9) of ceramic material, in order to reduce the electrical resistance thereof. The brazing material (6) also covers the buffer layers (5).

The thickness of the layer of brazing material (6) in this case is typically equal to or less than the thickness of the composite buffer layers (5) and is between 50% and 200% of the thickness of the electrodes (2a, 2b) printed on the plates (8, 9) of ceramic material.

The material of the layer of brazing material (6) is therefore advantageously spread over the free surface of the metal electrode (2a, 2b) in order to cover at least part or all of the surface thereof that is not covered by the buffer layer (5).

Advantageously, the layer of brazing material (6), illustrated for example in FIG. 2, also extends around the buffer layer (5) forming a peripheral collar (6a) surrounding said buffer layer (5) over a portion of the height thereof.

Different possible proportions can advantageously be adapted to the n- or p-type thermoelectric material of the central layer (3a) or (3b). In the case of $Ti_xAg_{1-x}$, the value of x is 0.86 for the n-type thermoelectric element and 0.57 for the p-type.

Advantageously, the cumulative thickness of the two buffer layers (5) of a thermoelectric element (1) is greater than or equal to 50% of the thickness of the central layer (3a) or (3b).

According to another preferred embodiment, said cumulative thickness is greater than or equal to 100% of the thickness of the central layer (3a) or (3b).

According to another particularly preferred embodiment, said cumulative thickness is greater than or equal to 200% of the thickness of said central layer (3a) or (3b).

For example, the central layer (3a) or (3b) has a thickness of between 200 μm and 2000 μm.

The thickness of each buffer layer (5) is between 500 μm and 5000 μm.

The thickness of each intermediate layer (3) is preferably between 10 μm and 200 μm.

A thermoelectric element (1) advantageously has, along a section transverse to the assembly direction A, a surface area between 4 mm2 and 100 mm2.

Figure 3:
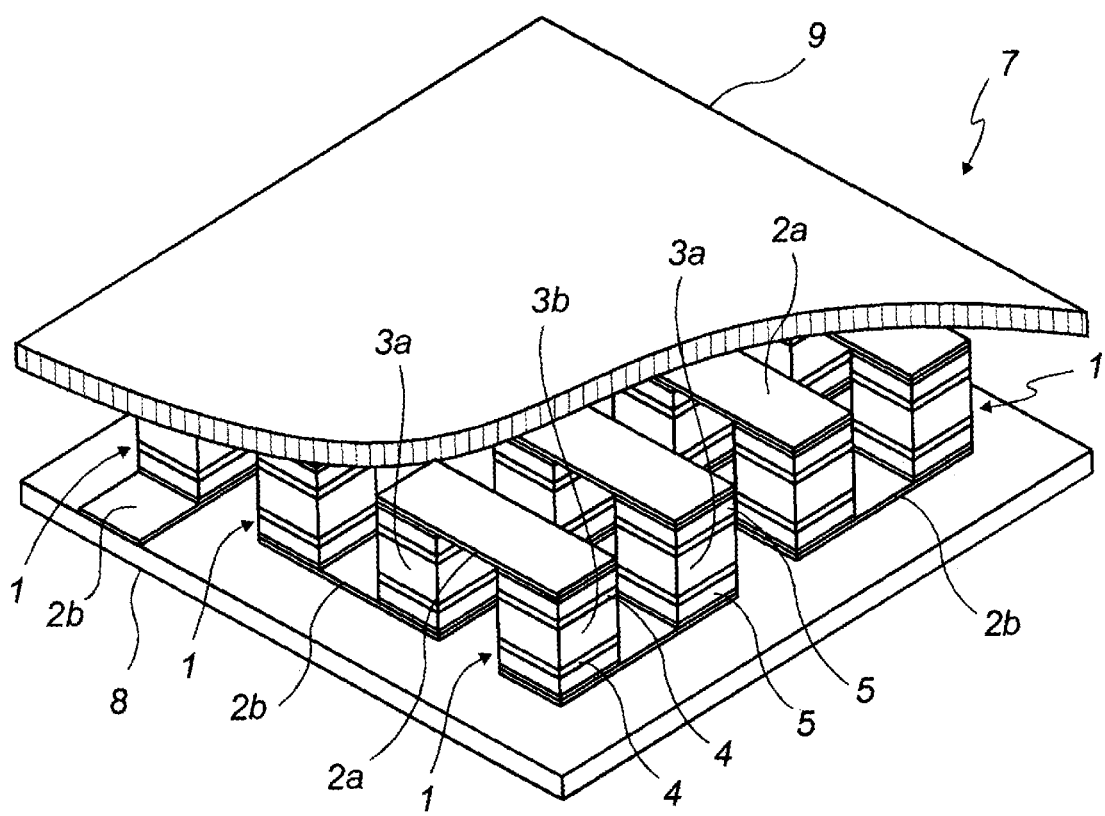
FIG. 3 is a perspective view, partially cut away, of an embodiment of a thermoelectric converter.

FIG. 3 is a perspective view, partially cut away, of an embodiment of a thermoelectric converter (7), incorporating the thermoelectric elements (1). The thermoelectric converter (7) comprises two plates of ceramic material (8) and (9) that are substantially parallel to each other and spaced apart from each other by an assembly of thermoelectric elements (1).

The metal electrodes (2a) and (2b) are respectively secured onto two facing surfaces of said plates (8) and (9) of ceramic material.

The distribution and attachment of the electrodes (2a) and (2b) on the respective plates (8) and (9) of ceramic material is achieved according to known technologies, so as to enable the assembly of said plates (8) and (9) with the thermoelectric elements (1).

For example, two assemblies of twelve thermoelectric elements (1), six n-type and six p-type, were produced and the electrical power thereof was measured. Each thermoelectric element comprises buffer layers (5) of TixAg1-x, a diffusion layer of Ni and a thermoelectric layer as follows: skutterudite In0.4Co4Sb12 for the n-type, and skutterudite Ce0.9Fe3.5Co0.5Sb12 for the p-type. The respective thicknesses of said layers were 1000 µm, 10 µm and 500 µm for the first assembly and 1000 µm, 10 µm and 1000 µm for the second. The transverse surface area of each thermoelectric element was about 2.5 mm×2.5 mm, corresponding to 6.25 mm2 for the first and 2 mm×2 mm, corresponding to 4 mm2 for the second.

Subject to a temperature difference of 500 K, the measured electrical power was 3.1 W, corresponding to a power density of 4.1 W·cm−2 for the first and 3.6 W, corresponding to a power density of 7.5 W·cm-2 for the second.

These achieved power densities are quite remarkable compared to the values of the prior art, which at best are on the order of 1 W·cm-2, especially taking into account the small quantity of thermoelectric material used.

It is evident that this description is not limited to the examples explicitly described, but also comprises other embodiments and/or implementations. Thus, a described technical characteristic can be replaced by an equivalent technical characteristic without going beyond the scope of the present disclosure.

The invention claimed is:

1. A thermoelectric converter comprising two plates substantially parallel to each other and spaced apart from each other by an assembly of thermoelectric elements and metal electrodes secured on the one hand to a facing surface of each of the two plates according to a specific distribution, and on the other hand to one of two buffer layers via a layer of brazing material, said buffer layers being secured to the metal electrodes, wherein the two plates are ceramic,
    wherein each thermoelectric element includes an assembly of constituent layers comprising a central layer of p- or n-type thermoelectric material, then, in an assembly direction, and on each side of said central layer, an intermediate layer forming a diffusion barrier followed by one of the two buffer layers made of composite metal material,
    wherein the cumulative thickness of the two buffer layers is greater than or equal to 50% of the thickness of the central layer, and in that the constituent material of the two buffer layers is an alloy of two metals selected from the group consisting of: $Ti_xAg_{1-x}$, $V_xFe_{1-x}$, $V_xAg_{1-x}$, and $Ti_xFe_{1-x}$, where 0<x<1, and
    wherein the thickness of the layer of brazing material is equal to or less than the thickness of the buffer layers of composite metal material.

2. The thermoelectric converter according to claim 1, wherein the central layer has a thickness between 200 µm and 2000 µm.

3. The thermoelectric converter according to claim 1, wherein each buffer layer has a thickness between 500 µm and 5000 µm.

4. The thermoelectric converter according to claim 1, wherein each intermediate layer has a thickness between 10 µm and 200 µm.

5. The thermoelectric converter according to claim 1, wherein the thermoelectric element has, along a section transverse to the assembly direction, a surface area between 4 mm² and 100 mm².

6. The thermoelectric converter according to claim 1, wherein the constituent material of the central layer is n- or p-type skutterudite.

7. The thermoelectric converter according to claim 1, wherein the constituent material of the intermediate layers is selected from the group consisting of nickel, titanium, chromium, tantalum, hafnium, niobium, zirconium, vanadium, yttrium, tungsten, tantalum nitride, indium oxide, copper silicide, tungsten nitride, and titanium nitride.

8. The thermoelectric converter according to claim 1, wherein the layer of brazing material disposed between the buffer layers and the metal electrodes comprises contain aluminum in particular.

9. The thermoelectric converter according to claim 1, wherein the thickness of the layer of brazing material is between 50% and 200% of the thickness of the electrodes printed on the plates of ceramic material.

10. A thermoelectric converter according to claim 1, wherein the layer of brazing material covers at least a portion of a free surface of the metal electrode.

11. A thermoelectric converter according to claim 1, wherein the layer of brazing material extends around each buffer layer, forming a peripheral collar surrounding said buffer layer over a portion of the height of said buffer layer.

12. A thermoelectric converter comprising two plates of ceramic material substantially parallel to each other and spaced apart from each other by an assembly of thermoelectric elements and metal electrodes secured on the one hand to a facing surface of each of the two plates according to a specific distribution, and on the other hand to one of two buffer layers via a layer of brazing material, said buffer layers being secured to metal electrodes, wherein the two plates are ceramic,
    wherein each thermoelectric element includes an assembly of constituent layers comprising a central layer of p- or n-type thermoelectric material, then, in an assembly direction, and on each side of said central layer, an intermediate layer forming a diffusion barrier followed by one of the two buffer layers made of composite metal material,
    wherein the cumulative thickness of the two buffer layers is greater than or equal to 100% of the thickness of the central layer, and in that the constituent material of the two buffer layers is an alloy of two metals selected from the group consisting of: $Ti_xAg_{1-x}$, $V_xFe_{1-x}$, $V_xAg_{1-x}$, and $Ti_xFe_{1-x}$, where 0<x<1, and
    wherein the thickness of the layer of brazing material is equal to or less than the thickness of the buffer layers of composite metal material.

13. The thermoelectric converter of claim 12, wherein the cumulative thickness of the two buffer layers is greater than or equal to 200% of the thickness of the central layer.

14. A thermoelectric converter comprising first and second plates each having facing surfaces, the first and second plates being substantially parallel to one another and spaced apart by an assembly of thermoelectric elements and metal electrodes, the assembly of thermoelectric elements and metal electrodes comprising:
    a first set of metal electrodes secured to the facing surface of the first plate;

a second set of metal electrodes secured to the facing surface of the second plate; and thermoelectric elements, each thermoelectric element being disposed between and electrically connected to at least one metal electrode from the first set of metal electrodes and at least one metal electrode from the second set of metal electrodes, and wherein:

the first and second plates are ceramic;

each thermoelectric element comprises:

- a central layer disposed between first and second intermediate layers, the first and second intermediate layers forming a diffusion barrier, and
- a first buffer layer secured to the at least one metal electrode from the first set of metal electrodes via a first layer of brazing material such that the first buffer layer is disposed between the first intermediate layer and the at least one metal electrode from the first set of metal electrodes, and
- a second buffer layer secured to the at least one metal electrode from the second set of metal electrodes via a second layer of brazing material such that the second buffer layer is disposed between the second intermediate layer and the at least one metal electrode from the second set of metal electrodes;

the central layer comprises p- or n-type thermoelectric material; and the cumulative thickness of the first and the second buffer layers is greater than or equal to 50% of the thickness of the central layer, and each of the first buffer layer and the second buffer layer comprises an alloy of two metals selected from the group consisting of: $Ti_xAg_{1-x}$, $V_xFe_{1-x}$, $V_xAg_{1-x}$, and $Ti_xFe_{1-x}$, where $0<x<1$.

15. The thermoelectric converter of claim 14, wherein each metal electrode of the first set of metal electrodes is orthogonal to each metal electrode of the second set of metal electrodes.

16. The thermoelectric converter of claim 14, wherein each metal electrode of the first set of metal electrodes is electrically connected to at least two thermoelectric elements.

17. The thermoelectric converter of claim 16, wherein each of the two thermoelectric elements is electrically connected a different metal electrode of the second set of metal electrodes.

18. The thermoelectric converter of claim 14, wherein the thickness of each of the first and second layers of brazing material is equal to or less than the thickness of each of the first buffer later and second buffer layer, respectively.

19. The thermoelectric converter of claim 14, wherein the cumulative thickness of the first and second buffer layers is greater than or equal to 100% of the thickness of the central layer.

20. The thermoelectric converter of claim 14, wherein the cumulative thickness of the first and second buffer layers is greater than or equal to 200% of the thickness of the central layer.

* * * * *